United States Patent
Mollier et al.

(10) Patent No.: US 12,253,546 B2
(45) Date of Patent: Mar. 18, 2025

(54) VOLTAGE PRESENCE DETERMINATION SYSTEM FOR A HIGH VOLTAGE ELECTRICAL NETWORK

(71) Applicant: Schneider Electric Industries SAS, Rueil Malmaison (FR)

(72) Inventors: Christophe Mollier, Coublevie (FR); Etienne Guillaud-Rollin, Echirolles (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 119 days.

(21) Appl. No.: 17/988,390

(22) Filed: Nov. 16, 2022

(65) Prior Publication Data
US 2023/0160931 A1 May 25, 2023

(30) Foreign Application Priority Data
Nov. 22, 2021 (FR) ...................... 2112355

(51) Int. Cl.
*G01R 19/00* (2006.01)
*G01R 31/3842* (2019.01)

(52) U.S. Cl.
CPC ..... *G01R 19/0084* (2013.01); *G01R 31/3842* (2019.01)

(58) Field of Classification Search
CPC .......... G01R 19/0084; G01R 31/3842; H01M 50/50; H01M 50/569
USPC .... 324/500, 639, 642, 702, 76.11, 76.66, 96
See application file for complete search history.

(56) References Cited

U.S. PATENT DOCUMENTS

| 2011/0012740 A1 | 1/2011 | Macdougall et al. |
| 2016/0056729 A1* | 2/2016 | Tenca ...................... H02M 1/32 363/135 |
| 2017/0229857 A1* | 8/2017 | Kral .......................... H02J 3/38 |
| 2019/0101574 A1 | 4/2019 | Mollier |
| 2020/0256910 A1* | 8/2020 | Golnari ................ G01R 31/088 |
| 2022/0360161 A1* | 11/2022 | Adamczyk .......... H02M 5/4505 |

FOREIGN PATENT DOCUMENTS

| EP | 2538229 A1 | 12/2012 |
| EP | 3361268 A1 | 8/2018 |
| FR | 2984514 A1 | 6/2013 |
| FR | 3071927 B1 | 9/2019 |

OTHER PUBLICATIONS

French Search Report and Written Opinion dated Jul. 6, 2022 for corresponding French Patent Application No. FR2112355, 10 pages.

* cited by examiner

*Primary Examiner* — Thang X Le
*Assistant Examiner* — Trung Q Nguyen
(74) *Attorney, Agent, or Firm* — Troutman Pepper Locke LLP

(57) ABSTRACT

A voltage presence determination system intended to be connected to a voltage measurement sensor for at least one phase of a high-voltage electrical network. The system comprises, for the at least one phase: a visual indicator of the presence of a voltage measured by the voltage measurement sensor, referred to as the measured voltage, a first output terminal configured to receive a first output signal, a second output terminal configured to receive a second output signal, and a plurality of linear components. The system is configured so that the first and second output terminals are functionally isolated from one another and functionally isolated from the visual indicator only by the plurality of linear components.

14 Claims, 1 Drawing Sheet

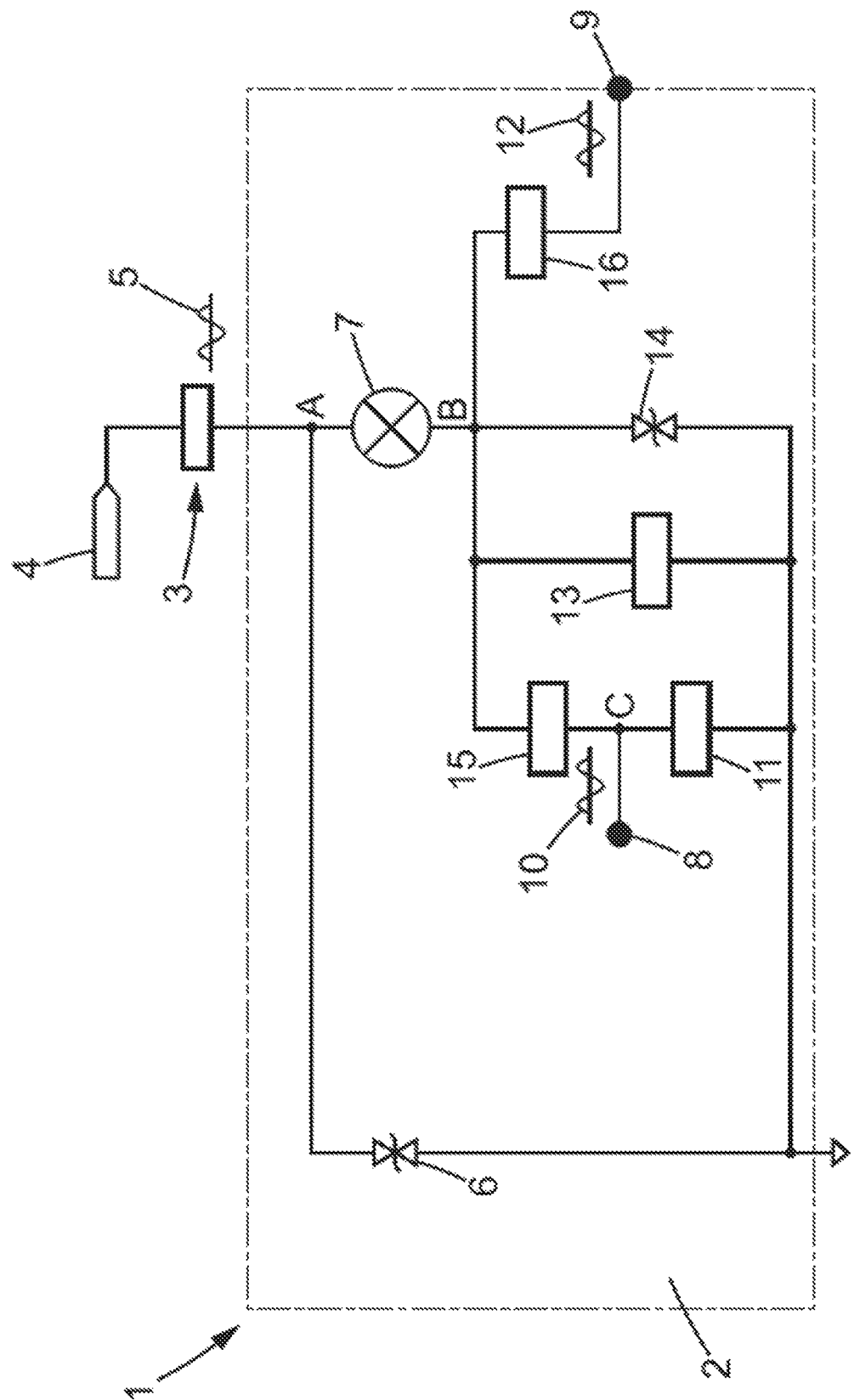

VOLTAGE PRESENCE DETERMINATION SYSTEM FOR A HIGH VOLTAGE ELECTRICAL NETWORK

TECHNICAL FIELD

The present disclosure relates to a voltage presence determination system for a high-voltage electrical network, and to an associated electrical apparatus.

PRIOR ART

Conventionally, the voltage state of an electrical apparatus belonging to a high-voltage electrical network is determined using a voltage presence determination system which is installed on a front face of the electrical apparatus or unit. The voltage presence determination system indicates, generally visually, the presence of voltage in each phase of the electrical apparatus, for example using a warning light or a liquid-crystal display (LCD) associated with each of said phases lighting up.

The voltage presence determination system may be a voltage detection system, commonly called a VDS and described by the CEI 61243-5 standard, or a voltage presence indication system, commonly called a VPIS and described by the CEI 62271-206 standard, formerly CEI 61958. The voltage presence determination system may also be a voltage detection and indication system, or VDIS, described by the CEI 62271-213 standard, which has replaced and merged the CEI 61243-5 and CEI 62271-206 standards.

Besides indicating the presence of voltage, the VDS, VPIS and VDIS devices may fulfil, for each phase of the electrical apparatus, a voltage measurement function and a phase comparison function. In particular, a first signal, allowing the voltage on each of the phases to be estimated, is accessible from one output terminal of the voltage presence determination system, and a second signal, which is representative of a phase angle of the voltage on each phase, is accessible from another output terminal of the voltage presence determination system. The phase comparison function allows a phase comparator to be coupled to two signalling devices of different electrical apparatuses so as to check the direct correspondence between the phases of the two apparatuses, in order to avoid the phases crossing, for example when connecting these cells during a reconfiguration of the network or after any intervention following an incident.

According to the CEI 61243-5, CEI 62271-206 and CEI 62271-213 standards, the voltage presence indication, voltage measurement and phase comparison functions of the voltage presence determination system are wired in parallel. As a result, when one of these functions is defective, because, for example, it is in a short circuit, the other functions will also be defective. This causes a major risk to the safety of an operator using the electrical apparatus as they will not be alerted to the presence of voltage in it if, for example, a faulty phase comparator is coupled to the respective output terminal of the voltage presence determination system.

FR 3 071 927 B1 discloses the use of a clipper to avoid this problem in an apparatus equipped with a VPIS device. Clippers are, in particular, composed of two Zener diodes connected top to tail in series and which are arranged so as to avoid the malfunctioning of one of the functions of the VPIS causing the malfunctioning of the other functions.

However, the new CEI 62271-213 standard, which is applicable to VDIS devices, demands that output signals be in phase with the voltage of the network, this preventing the use of Zener diodes, whether active or passive in nominal operation, which lead to a phase difference among the output signals. It is therefore necessary to find a solution which guarantees that the malfunctioning of one of the voltage presence indication, voltage measurement or phase comparison functions in a VDIS device does not cause the malfunctioning of the other functions.

Above and beyond the new CEI 62271-213 standard, it is generally desirable to also have an output signal which is representative, in terms of amplitude and angle, of the voltage of the network at the output terminal associated with the voltage measurement function in order to be able to make power measurements.

SUMMARY

The present disclosure improves the situation.

A voltage presence determination system is proposed which is intended to be connected to a voltage measurement sensor for at least one phase of a high-voltage electrical network, the system comprising, for said at least one phase:
  a visual indicator of the presence of a voltage measured by the voltage measurement sensor, referred to as the measured voltage,
  a first output terminal configured to receive a first output signal which is representative of the measured voltage in terms of phase angle and amplitude,
  a second output terminal configured to receive a second output signal which is representative of the measured voltage in terms of phase angle and amplitude, and
  a plurality of linear components,
the first and second output terminals being connected downstream of the visual indicator,
the system being configured so that the first and second output terminals are functionally isolated from one another and functionally isolated from the visual indicator only by the plurality of linear components.

The visual presence indicator, the first output terminal and the second output terminal allow the voltage presence determination system to perform the voltage presence indication, voltage measurement and phase comparison functions of the voltage presence determination system.

By virtue of the plurality of linear components, the first and second output terminals are functionally isolated from one another, this preventing a malfunction at one of the output terminals from causing the malfunctioning of the other output terminal. Moreover, with the plurality of linear components also ensuring that the visual presence indicator is functionally isolated from the first and second output terminals, a malfunction at one of the output terminals is also prevented from causing the malfunctioning of the visual presence indicator, and vice versa.

The three functions of the voltage presence determination system are thus isolated without the need to use Zener diodes, but only using the plurality of linear components.

According to another aspect, the plurality of linear components comprises, for each phase, a first set of linear components which is connected to the first output terminal and a second set of linear components which is connected to the second output terminal.

According to another aspect, the first set of linear components and the second set of linear components are connected in parallel with one another.

According to another aspect, each set of linear components has an impedance comprising a capacitive portion or a resistive portion.

According to another aspect, each set of linear components is an impedance of the same type as an impedance of the voltage measurement sensor.

According to another aspect, the system comprises, for each phase, an electrical protection module connected between an entry point and earth, the entry point being placed between the impedance of the voltage measurement sensor and the visual indicator.

According to another aspect, the visual indicator comprises at least one light-emitting diode or a liquid-crystal display, and is configured to be activated when a measured current is above a first threshold and to be switched off when the measured current is below a second threshold.

According to another aspect, the first threshold is equal to a current associated with a voltage which is equal to 45% of a phase-to-phase nominal voltage.

According to another aspect, the second threshold is equal to a current associated with a voltage which is equal to 10% of the phase-to-phase nominal voltage.

Another subject of the invention is an electrical apparatus comprising at least one unit of electrical switchgear and a voltage presence determination system as described previously.

BRIEF DESCRIPTION OF THE DRAWINGS

Other features, details and advantages will become apparent from reading the description provided below and from examining the appended drawings, wherein:

FIG. 1 shows a diagram of an electrical circuit comprising an example of a voltage presence determination system according to the invention.

DESCRIPTION OF THE EMBODIMENTS

In the description which follows, the expression "high-voltage" is taken to mean any voltage which is greater than 1000 V.

FIG. 1 shows a diagram of an electrical circuit equipped with a voltage presence determination system 1 for an electrical apparatus belonging to a high-voltage electrical network. Preferably, the electrical apparatus also comprises a multiphase device, such as a high-voltage unit of electrical switchgear.

In what follows, the system 1 is a VDIS device in accordance with the CEI 62271-213 standard, but it could also be a VDS or VPIS device as presented hereinafter.

The system 1 comprises an electronic circuit 2 for each phase of the electrical apparatus. Each electronic circuit 2 may comprise one or more printed circuits.

As emerges from FIG. 1, the electronic circuit 2 is connected to a voltage measurement sensor 3. The sensor 3 is connected between a phase 4 of the electrical apparatus and an entry point A of the system 1. The sensor 3 preferably comprises an impedance of capacitive type, but it could also be an impedance of resistive type. The sensor 3 is, for example, of bushing capacitor type.

The sensor 3 allows a voltage which is present in the phase 4 to be measured with respect to earth, which will also be called the "measured voltage" in what follows. In particular, the sensor 3 delivers a sinusoidal signal 5 which is representative of the voltage measured in the respective phase 4 with respect to earth. The signal 5 is received by the system 1 at the entry point A. The system 1 is therefore self-powered by the sensor 3 using the sinusoidal signal 5.

The various components which the system 1 comprises for each phase of the apparatus will now be described according to the non-limiting example of FIG. 1.

The system 1 comprises an electrical protection module 6 for protecting against transient overvoltages. The electrical protection module 6 is connected between the entry point A and earth. In FIG. 1, the module 6 comprises two Zener diodes connected top to tail in series, but it could also be any other device making it possible to protect against overvoltages, such as a gas-filled spark gap. In the event of transient overvoltage in the system 1, for example due to a fault of the sensor 3, the module 6 is configured to have the overvoltage flow through it, so that the overvoltage does not flow through the rest of the system 1. The transient overvoltage is thus conducted to earth, this limiting the risk of damaging the system 1.

The system 1 further comprises a visual voltage presence indicator 7. The visual indicator 7 is located between the entry point A and a node B of the circuit 2. The visual indicator 7 preferably comprises at least one light-emitting diode (LED) or one liquid-crystal display (LCD).

Advantageously, the visual indicator 7 operates as an ammeter. In particular, the indicator 7 is configured to be activated when a current measured at the output of the sensor 3 is above a first threshold, referred to as the voltage presence threshold, and to be deactivated when the current measured at the output of the sensor 3 is below a second threshold, referred to as the voltage absence threshold, which is smaller than the first threshold. Between the first and the second thresholds, the indicator 7 is in an indeterminate state, that is to say that it may be either activated or deactivated.

In accordance with the CEI 62271-213 standard, the first threshold corresponds to the current associated with a voltage between the phase and earth which is equal to 45% of a phase-to-phase nominal voltage, while the second threshold corresponds to the current associated with a voltage between the phase and earth which is equal to 10% of the phase-to-phase nominal voltage. These thresholds may, of course, be adjusted to adapt the system 1 to other standards.

The visual indicator 7 therefore contributes to the voltage presence, particularly the measured voltage presence, indication function of the system 1.

The system 1 further comprises a first output terminal 8 and a second output terminal 9. The output terminals 8, 9 are connected downstream of the visual indicator 7 relative to a current flowing through the circuit 2.

The system 1 also comprises an impedance 11 located between a node C to which the terminal 8 is connected and earth. The impedance 11 may be a capacitor or a resistor according to whether the sensor 3 is capacitive or resistive.

The output terminal 8 receives a, preferably sinusoidal, first output signal 10 measured between node C and earth.

The signal 10 is representative of the measured voltage in terms of phase angle and amplitude. More specifically, the signal 10 represents an image of voltage which is proportional to and in phase with the voltage measured in the phase 4 with respect to earth.

Using the signal 10, it is possible to determine the various parameters of the measured voltage. An external unit, such as a voltage control relay, may be connected to the output terminal 8 in order to utilize the signal 10.

The system 1 can thus perform its voltage measurement function using the output terminal 8.

The output terminal 9 receives a second, sinusoidal output signal 12. The signal 12 is representative of the measured voltage in terms of phase angle and amplitude and may be utilized by an external unit, such as a phase comparator, connected to the output terminal 9. The signal 12 allows the matching of the phases between the two ends of an electrical distribution loop to be checked in order to avoid the phases crossing, which would lead to a short circuit. For this purpose, the phase comparator is connected to the output terminals 9 of the voltage presence determination system 1 of the two units in question.

The system 1 can thus perform its phase comparison function using the output terminal 9.

As clearly shown in FIG. 1, and according to the standards relating to VDIS, VPIS and VDS devices, the voltage presence indication, voltage measurement and phase comparison functions in the system 1 are wired in parallel.

The system 1 may also comprise an impedance 13, referred to as the foot impedance, and a voltage limiter 14.

The foot impedance 13 is connected between earth and node B. The impedance 13 may be a capacitor or a resistor. The impedance 13 allows the phase-to-phase nominal voltage value which is necessary for the voltage presence indication, voltage measurement and phase comparison functions of the system 1 to be functional to be determined.

The voltage limiter 14 is connected in parallel to the impedance 13. In particular, the voltage limiter 14 is connected between node B and earth. In the example of FIG. 1, the voltage limiter 14 is formed by two Zener diodes connected top to tail in series. Advantageously, the voltage limiter 14 is configured to be activated only when the voltage between the phase and earth is equal to or greater than 120% of the phase-to-phase nominal voltage, this allowing the visual indicator 7 to remain operational even when the measured voltage is high.

The system 1 further comprises a plurality of linear components. Advantageously, at least one linear component is arranged between node B and the output terminal 8 and at least one linear component is arranged between node B and the output terminal 9.

In FIG. 1, the system 1 comprises, in particular, a first set of linear components 15 and a second set of linear components 16, but this is not limiting. Each set of linear components 15, 16 comprises at least one linear component.

The first set of linear components 15 is connected to the output terminal 8. More specifically, the first set of linear components 15 is connected between nodes B and C, in series with the impedance 11. The second set of linear components 16 is connected to the output terminal 9. More specifically, the second set of linear components 16 is connected between node B and the terminal 9.

The sets of linear components 15 and 16 are therefore connected in parallel with one another. The sets of linear components 15 and 16 are further connected in series with the external units which are optionally connected to the output terminals 8 and 9, respectively. Furthermore, the sets of linear components 15 and 16 are connected upstream of the visual indicator 7 relative to the current flowing through the circuit 2.

Preferably, the sets of linear components 15, 16 are impedances which may comprise a capacitive portion or a resistive portion. Advantageously, each set of linear components 15, 16 is an impedance of the same type as the sensor 3. Thus, if the sensor 3 is a capacitive voltage sensor, the sets of linear components 15, 16 will be capacitive impedances while, if the sensor 3 is a resistive voltage sensor, the sets of linear components 15, 16 will be resistive impedances. The values of the sets of linear components 15, 16 are dependent on the voltage in the electrical apparatus and on the value from the sensor 3.

With the voltage measurement and phase comparison functions in the system 1 being wired in parallel, they use the same primary voltage. This would imply that a fault or a short circuit of one of the terminals 8, 9 would cause a short circuit in the voltage measurement and phase comparison functions. However, the arrangement of the sets of linear components 15, 16 in the system 1 allows the output terminals 8, 9 to be functionally isolated from one another. In particular, when a short circuit occurs at one of the output terminals 8, 9, the second set of linear components 16 and the first set of linear components 15, respectively, ensure that the voltage and the current which are available at the opposite output terminal 9, 8 are greater than the voltage and than the current which are associated with the second threshold (voltage absence threshold) if the voltage and the current in the system 1 are greater than the first threshold (voltage presence threshold).

Furthermore, the arrangement of the output terminals 8, 9 and of the sets of linear components 15, 16 downstream of the indicator 7 in the system 1 allows the output terminals 8, 9 to be functionally isolated from the visual indicator 7. This allows, in the event of a fault or short circuit of one of the terminals 8, 9, the current which is flowing through the visual indicator 7 to remain in the same order of magnitude as the current at the output of the sensor 3. The visual element 7 therefore remains activated when the voltage and the current in the system 1 are greater than the voltage and than the current which are associated with the first threshold. Thus, the risks to the safety of the operator using the electrical apparatus are limited.

The present disclosure is not limited to the example described hereinabove with reference to the figures. The present disclosure also encompasses all variants and combinations which a person skilled in the art might envisage within the desired scope of protection.

The invention claimed is:

1. A voltage presence determination system intended to be connected to a voltage measurement sensor for at least one phase of a high-voltage electrical network, the system comprising, for said at least one phase:
   a visual indicator of the presence of a voltage measured by the voltage measurement sensor, referred to as the measured voltage,
   a first output terminal configured to receive a first output signal which is representative of the measured voltage in terms of phase angle and amplitude,
   a second output terminal configured to receive a second output signal which is representative of the measured voltage in terms of phase angle and amplitude, and
   a plurality of linear components,
   the first and second output terminals being connected downstream of the visual indicator, the system being configured so that the first and second output terminals are functionally isolated from one another and functionally isolated from the visual indicator only by the plurality of linear components.

2. The system according to claim 1, wherein the plurality of linear components comprises, for each phase, a first set of linear components which is connected to the first output terminal and a second set of linear components which is connected to the second output terminal.

3. The system according to claim 2, wherein the first set of linear components and the second set of linear components are connected in parallel with one another.

4. The system according to claim 1, wherein each set of linear components has an impedance comprising a capacitive portion or a resistive portion.

5. The system according to claim 1, wherein each set of linear components is an impedance of the same type as an impedance of the voltage measurement sensor.

6. The system according to claim 1, comprising, for each phase, an electrical protection module connected between an entry point and earth, the entry point being placed between the impedance of the voltage measurement sensor and the visual indicator.

7. The system according to claim 1, wherein the visual indicator comprises at least one light-emitting diode or a liquid-crystal display, and is configured to be activated when a measured current is above a first threshold and to be switched off when the measured current is below a second threshold.

8. The system according to claim 7, wherein the first threshold is equal to a current associated with a voltage which is equal to 45% of a phase-to-phase nominal voltage.

9. The system according to claim 7, wherein the second threshold is equal to a current associated with a voltage which is equal to 10% of the phase-to-phase nominal voltage.

10. An electrical apparatus comprising at least one unit of electrical switchgear and a voltage presence determination system according to claim 1.

11. The system according to claim 1, wherein the visual indicator comprises a liquid-crystal display, and is configured to be activated when a measured current is above a first threshold and to be switched off when the measured current is below a second threshold.

12. The system according to claim 1, wherein the visual indicator is configured to receive a sinusoidal signal, which is delivered from the voltage measurement sensor and is representative of the voltage measured by the voltage measurement sensor in the at least one phase with respect to earth.

13. The system according to claim 1, wherein each of the plurality of linear components has a capacitive impedance if the voltage measurement sensor is a capacitive voltage sensor, or each of the plurality of linear components has a resistive impedance if the voltage measurement sensor is a resistive voltage sensor.

14. The system according to claim 1, wherein the voltage measurement sensor is of a bushing capacitor type.

* * * * *